United States Patent
Ozawa (10) Patent No.: US 8,378,482 B2
(45) Date of Patent: Feb. 19, 2013

(54) WIRING BOARD (75) Inventor: Takashi Ozawa, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 354 days.

(21) Appl. No.: 12/465,964

(22) Filed: May 14, 2009

(65) Prior Publication Data
US 2009/0283317 A1 Nov. 19, 2009

(30) Foreign Application Priority Data
May 15, 2008 (JP) .................................. 2008-128194

(51) Int. Cl.
H01L 23/34 (2006.01)

(52) U.S. Cl. . 257/728; 438/108; 257/778; 257/E27.137; 257/E27.144; 257/E27.161

(58) Field of Classification Search .................. 174/267; 361/762; 257/728, 778, 779, E27.137, E27.144, 257/E27.161, E23.023; 438/108
See application file for complete search history.

(56) References Cited

U.S. PATENT DOCUMENTS

| 6,048,656 | A  | * | 4/2000 | Akram et al. ................. 438/118 |
| 6,291,264 | B1 | * | 9/2001 | Tang et al. ................... 438/106 |
| 7,687,321 | B2 | * | 3/2010 | Tajimi .......................... 438/127 |
| 2003/0090877 | A1 | * | 5/2003 | Ochiai et al. .................. 361/723 |

FOREIGN PATENT DOCUMENTS

| JP | 2005-175113 A1 | 6/2005 |
| JP | 3115828 | 10/2005 |

OTHER PUBLICATIONS

JP3115828—translation of Japanese pantent document submitted in IDS of the same name.*
JP3115828—Machine translation of Japanese patent document, of the same name, submitted in IDS, orignal japanese document date: Oct. 5, 2005; translated Jan. 2012.*
Japanese Office Action mailed Nov. 1, 2011 in counterpart application No. 2008-128194 with partial English translation (5 pages).

* cited by examiner

Primary Examiner — Chau Nguyen
Assistant Examiner — Theron Milliser
(74) Attorney, Agent, or Firm — Kratz, Quintos & Hanson, LLP (57) ABSTRACT A wiring board between which and a chip to be mounted a resin is filled includes: a substrate body on which a conductor portion to be connected to an electrode terminal of the chip is formed; and an insulating protection film formed on the substrate body and having an opening portion formed therein to expose the conductor portion. The opening portion is formed in such a manner that the edge thereof is positioned along and outside the outer shape of the chip except for a specific corner portion, and that the edge in the specific corner portion is positioned on a side of or inside the outer shape of the chip.

7 Claims, 6 Drawing Sheets

SECTIONAL VIEW ALONG A-A' LINE

FIG. 3B

SECTIONAL VIEW ALONG B-B' LINE

FIG. 6B (PRIOR ART)
SECTIONAL VIEW ALONG C-C' LINE

WIRING BOARD

CROSS-REFERENCE TO RELATED APPLICATIONS

This application is based on and claims priority of Japanese Patent Application No. 2008-128194 filed on May 15, 2008, the entire contents of which are incorporated herein by reference.

BACKGROUND OF THE INVENTION (a) Field of the Invention

The present invention relates to a wiring board for use in mounting thereon an object to be mounted such as a semiconductor chip or a semiconductor device. More particularly, the present invention relates to a wiring board having a structure in which resin is filled between a semiconductor chip or the like and the wiring board when the semiconductor chip or the like is mounted thereon by flip chip bonding.

Note that, the "wiring board" is hereinafter also referred to as a "semiconductor package" or merely a "package" for the sake of convenience, because it has the function of mounting thereon a semiconductor chip or the like.

(b) Description of the Related Art

In recent years, semiconductor devices have been incorporated into various electronic devices. As electronic devices have been made smaller in size and higher in function, semiconductor devices incorporated into these electronic devices have also been made smaller in size, higher in packaging density, and higher in pin count (higher in terminal count). In addition, the reliability required for these semiconductor devices tends to increase. In general, a semiconductor device has a structure in which a semiconductor chip is mounted on a wiring board (package). As the semiconductor chip to be mounted has been made smaller in size and higher in packaging density, flip chip mounting is widely used as the mounting method.

This flip chip mounting is a mounting method including: first forming bump-shaped electrode terminals (bumps) on a semiconductor chip; and then bonding the electrode terminals of the chip to conductor portions using a conductive material such as solder, the conductor portions being formed on a mounting surface side of the package (i.e. pad portions which are part of a wiring layer exposed from a protection film). Moreover, in order to insulate the bonded portion from the outside thereof, and to enhance its bonding strength, a resin called underfill (such as an epoxy thermosetting resin) is filled into a gap between the package and the chip, and then is fixed by curing.

Since the electrode terminals of the chip and the wiring layer (pad portions) of the wiring board need to be electrically connected in the flip chip mounting, an opening portion for exposing the pad portions is formed in the protection film (typically, a solder resist layer) formed to coat the surface of the wiring board. The arrangement of the pad portions to be formed on the wiring board is determined in accordance with the arrangement of the electrode terminals of a chip to be mounted. Thus, the required shape of the opening portion is also determined in accordance therewith. For example, in the case where electrode terminals of a chip to be mounted are arranged in a peripheral shape (an annular shape along the circumference of the chip), pad portions to be formed on the wiring board are also arranged in the annular shape accordingly. Thus, the opening portion for exposing the pad portions needs to be formed at least in an annular shape in this case.

Thus the required opening portion needs to be formed in the solder resist layer. However, where the edge of the opening portion is positioned inside the mounting area of the chip on the wiring board, the following problems occur. Specifically, in this form, the gap between the solder resist layer and the chip is smaller in vertical dimension than that between the opening portion and the chip. Accordingly, when an underfill resin is filled between the chip and the wiring board, the underfill resin spreads quicker over the solder resist layer than the opening portion by capillary action. As a result, the underfill resin is filled in the circumference of the opening portion quicker than the inside thereof. This causes a void (air bubble) to be formed within the resin filled in the inside of the opening portion. When the void is formed, the connection reliability between the chip and package is lowered because sufficient bonding strength cannot be obtained. In addition, the air inside the void expands due to heat processing after the filling of the resin, which may generate a crack in the underfill resin, and in some cases, may disconnect the electrode terminals of the chip and the wiring layer from each other.

Figure 6A:
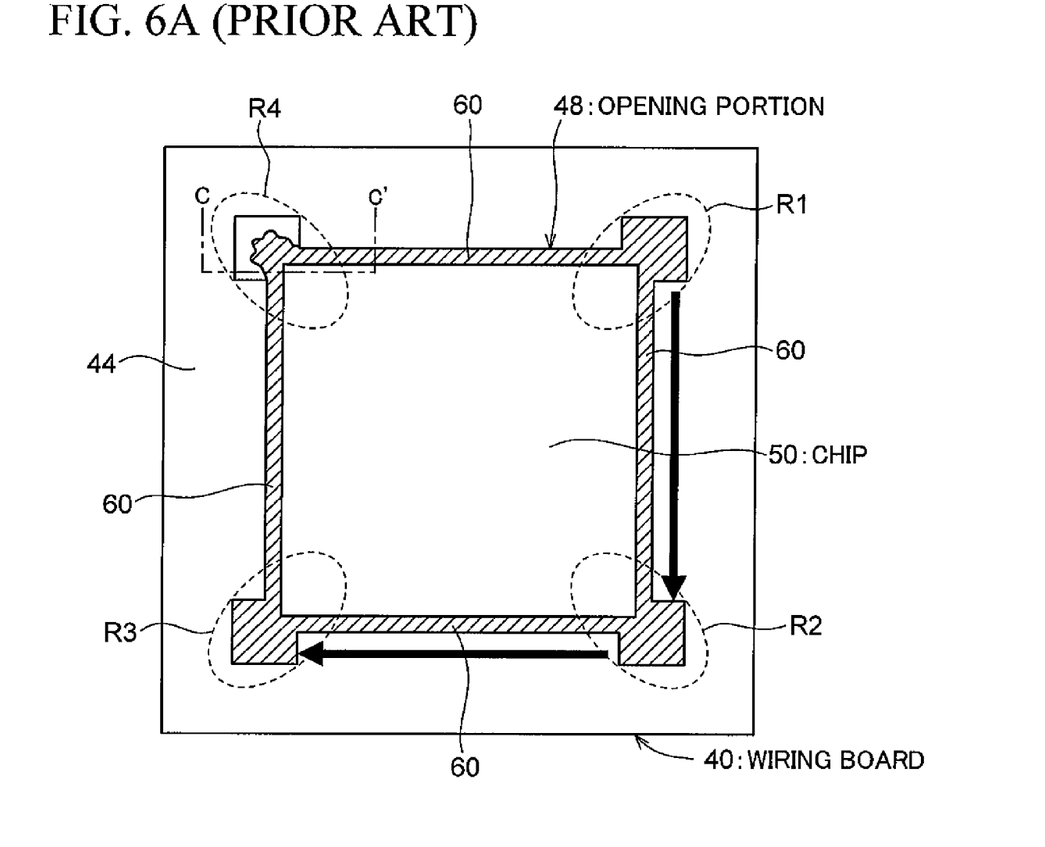
FIG. 6A is a plan view showing a state where a gap between a semiconductor chip and the wiring board is filled with resin when the semiconductor chip is mounted.
Figure 6B:
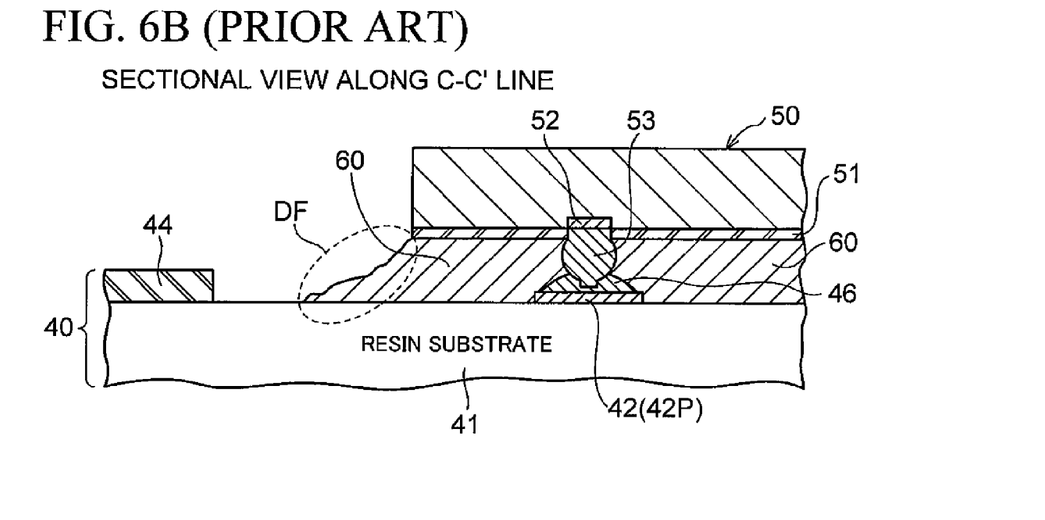
FIG. 6B is a view showing a cross-sectional structure when viewed along C-C' line of FIG. 6A (the vicinity of a corner portion in the opening portion).

A conceivable way to prevent formation of such a void is to form an opening portion in the solder resist layer in such a manner that the edge of the opening portion is positioned outside the mounting area of the chip (i.e., to form the opening portion larger than the chip size). FIGS. 6A and 6B illustrate an example of the way.

FIG. 6A is a plan view illustrating a state where a resin is filled in a gap formed when a semiconductor chip is mounted on a prior art wiring board (package) for flip chip mounting. FIG. 6B illustrates a cross-sectional structure when viewed along C-C' line in the plan view of FIG. 6A. In FIGS. 6A and 6B, reference numeral 40 denotes a wiring board. In the wiring board 40, reference numeral 41 denotes a resin substrate constituting a substrate body; reference numeral 42 denotes a wiring layer formed on an outermost surface of the resin substrate 41; reference numeral 44 denotes a solder resist layer which is formed on the resin substrate 41 as a protection film while exposing a pad portion 42P defined at a portion of the wiring layer 42; and reference numeral 46 denotes solder for use in mounting the chip, which is attached to the pad portion 42P. In addition, reference numeral 50 denotes a semiconductor chip mounted on the wiring board 40. In the chip 50, reference numeral 51 denotes a protection film coated on the circuit forming surface side of the chip 50; reference numeral 52 denotes an electrode pad formed to be exposed from the protection film 51; and reference numeral 53 denotes a bump-shaped electrode terminal (bump) bonded to the electrode pad 52.

The electrode terminal (bump) 53 of the chip 50 is bonded to the pad portion 42P on the wiring board 40 via the solder 46 attached to the pad portion 42P. In this manner, the chip 50 is mounted on the wiring board 40 by flip chip bonding. Moreover, an underfill resin 60 is filled between the wiring board 40 and the chip 50 mounted thereon by flip chip bonding.

An opening portion 48 required for exposing the pad portion 42P of the wiring layer 42 provided on the chip mounting surface side is formed in the solder resist layer 44 provided for protecting the surface of the wiring board 40. This opening portion 48 is formed in such a manner that the edge thereof is positioned along and outside the outer shape (rectangle) of the chip 50 (specifically, in such a manner that the opening portion 48 is opened larger than the size of the chip). Moreover, four corners of the opening portion 48 (corner portions R1, R2, R3 and R4) are formed to be opened locally larger, respectively. The reason for widely forming each of the corner portions R1 to R4 is to facilitate injection of the underfill resin 60.

The filling (injection) of the underfill resin 60 is carried out, for example, by moving a nozzle of a dispenser containing a liquid epoxy resin along the sides of the opening portion 48 in the gap between the chip 50 and the wiring board 40. For example, the filling (injection) of the resin into the opening portion 48 is started from any one of the corner portions R1 to R4, and carried out by moving the nozzle of the dispenser to an adjacent corner along the side of the opening portion 48 as indicated by the arrows in FIG. 6A. The example illustrated in FIG. 6A shows the case where the underfill resin 60 is injected along two sides of the opening portion 48 (i.e., the side between the corner portions R1 and R2, and the side between the corner portions R2 and R3). Alternatively, the filling (injection) of the resin may be started from a middle portion of any one of the sides of the opening portion 48, and carried out by moving the nozzle along the corresponding side in the same manner as that in the above case. Hereinafter, the side of the opening portion 48 along which the underfill resin 60 is injected is referred to as a "resin injection side" for the sake of convenience.

As illustrated in FIGS. 6A and 6B, the underfill resin 60 can be quickly spread within a gap between the chip 50 and the wiring board 40 by forming the opening portion 48 larger in size than the chip. Specifically, when the filling of the underfill resin 60 is started from any one of the resin injection sides of the opening portion 48, an inner portion of the opening portion 48 is more likely to be filled with the injected underfill resin 60 by capillary action, and also, air can be released from the opening and corner portions which are opposite to the resin injection side (i.e., downstream side of the flow of the underfill resin 60). Thus the underfill resin 60 can be quickly spread in the gap between the chip 50 and the wiring board 40. As a result, the generation of a void within the underfill resin 60 filled in the opening portion 48 can be prevented.

An example of technique related to the above prior art is described in Japanese unexamined Patent Publication (Kokai) 2005-175113. This publication discloses a printed wiring board for flip chip mounting. This printed wiring board includes: a substrate body on which an IC chip is mounted and a board conductor connected to an electrode of the IC chip is formed; and an insulating protection film which is formed on the substrate body and which has an opening portion formed therein at a mounting position of the IC chip. In this printed wiring board, a resin is filled between the IC chip and the substrate body in the state where the IC chip is mounted on the substrate body; the distance between each side of the outer shape of the IC chip and the opening edge of the insulating protection film is selected to be a predetermined value; and all of the four corners of the opening portion are widely opened.

As described above, in the prior art semiconductor package (FIG. 6A), the opening portion is formed larger in size than the chip in the solder resist layer provided for protecting the package. Thereby, when an underfill resin is filled between the chip and the package after mounting the chip on the package, the generation of a void within the filled resin is prevented. Such a shape of the opening portion is effective in preventing the generation of a void. However, there is a disadvantage in that a fillet of the underfill resin 60 (portion surrounded by a broken line DF) is not sufficiently formed as schematically illustrated in the cross-sectional view of FIG. 6B (cross-sectional view of the vicinity of the corner portion R4 in the opening portion 48).

Specifically, as illustrated in FIG. 6A, the resin injection sides along which the underfill resin 60 is injected (the sides of the opening portion 48 illustrated with arrows) and the opposite sides (downstream side of the flow of the underfill resin 60) are formed in the same shape. Thus, it is highly possible that the underfill resin 60 does not sufficiently flow to the opposite sides, in particular, to the corner portion R4. When the underfill resin 60 does not sufficiently flow thereto, the opening portion of the corner portion R4 fails to be sufficiently filled with the resin 60. As a result, the portion not coated with the underfill resin 60 (portion where the resin substrate 41 is exposed) is formed as illustrated in FIG. 6B. In the illustrated example, since the exposed portion corresponds to an insulating layer of the resin substrate 41, there is no particular problem in operation as the package. However, the presence of such area depreciates the appearance of the package. Namely, the insufficient fillet of the underfill resin 60 adversely affects outer appearance.

In addition, although not particularly illustrated, some packages have a wiring or the like formed in the locally widely opened corner portion. In this type of package, when the corner portion is not sufficiently filled with the resin as exemplified in FIG. 6, there occurs a problem in terms of insulation properties because the wiring or the like is exposed.

These problems are not peculiar to a semiconductor package represented by a ball grid array (BGA), a land grid array (LGA) or a pin grid array (PGA), and may possibly occur likewise in a flip chip mounting type package having a structure in which different packages are stacked on each other (also referred to as "package-on-package"). Specifically, taking into consideration the case where: first, a semiconductor chip is mounted on a lower package (wiring board) by flip chip mounting; then, bumps formed on a mounting surface side of an upper package are bonded, via solder or the like, to conductor portions (pad portions) formed in a peripheral region of the chip on the lower package; and an underfill resin is filled between the upper and lower packages, the above problem may possibly occur likewise.

SUMMARY OF THE INVENTION

An object of the present invention is to provide a wiring board capable of allowing a reliable formation of resin fillet by improving flow performance of resin in a corner portion of an object to be mounted such as a semiconductor chip without causing generation of void within resin when the resin is filled into a gap between the object and the wiring board in the state where the object is mounted.

According to the present invention, there is provided a wiring board between which and an object to be mounted a resin is filled when the object is mounted, the object having a polygonal shape in a plan view and having a bump-shaped electrode terminal on a mounting surface side thereof, the wiring board including: a substrate body including a conductor portion formed thereon, the conductor portion being to be connected to the electrode terminal of the object; and an insulating protection film formed on the substrate body and having an opening portion which is formed to expose at least the conductor portion in a mounting area corresponding to an outer shape of the object. In the wiring board, the opening portion is formed in such a manner that an edge thereof is positioned along and outside the mounting area of the object except for at least one corner portion of the opening portion, and that the edge thereof in the at least one corner portion is positioned on a side of or inside the mounting area of the object.

According to the configuration of the wiring board of the present invention, when the filling (injection) of resin is started from a side (resin injection side) of the opening portion which is positioned at an opposite side of the at least one corner portion (specific corner portion), the injected resin is filled to the inside of the opening portion by capillary action, and also, air can be released from the opening portion at the opposite side of the resin injection side (downstream side of the flow of the underfill resin). Thus, even when the resin first spreads over the protection film (such as a solder resist layer), a gap between the object (such as a chip) and the wiring board can be filled with the resin without causing generation of void (air bubble) within the filled resin.

In addition, since the opening portion at the specific corner is formed so that the edge thereof is positioned on the side of or inside the mounting area of the object, no relatively widely opened region such as other corner portions exists in the specific corner portion. Also, this specific corner portion is positioned at the opposite side of the resin injection side (downstream side of the flow of the resin). Specifically, the opening portion at the specific corner portion positioned at the opposite side of the resin injection side is formed relatively smaller. Thus, the opening portion of the specific corner portion can be sufficiently filled with the resin. As a result, the flow performance of the resin in the corner portion of the object (the portion corresponding to the specific corner of the opening portion) can be improved, thereby contributing to a reliable formation of resin fillet at the corner portion.

With reference to the following embodiments of the present invention, description is given below of other features in configuration of the wiring board according to the present invention, and of advantages based on the features thereof, and so on.

BRIEF DESCRIPTION OF THE DRAWINGS

FIGS. 3A and 3B show a vertical cross-sectional structure of the vicinity of an opening portion of the solder resist layer in the configuration of FIG. 2.

FIGS. 5A and 5B show a configuration of a wiring board for flip chip mounting according to still another embodiment of the present invention; FIGS. 6A and 6B show a configuration of a prior art wiring board for flip chip mounting.

DESCRIPTION OF THE PREFERRED EMBODIMENTS

Description is given below of preferred embodiments of the present invention with reference to the accompanying drawings.

Figure 1:
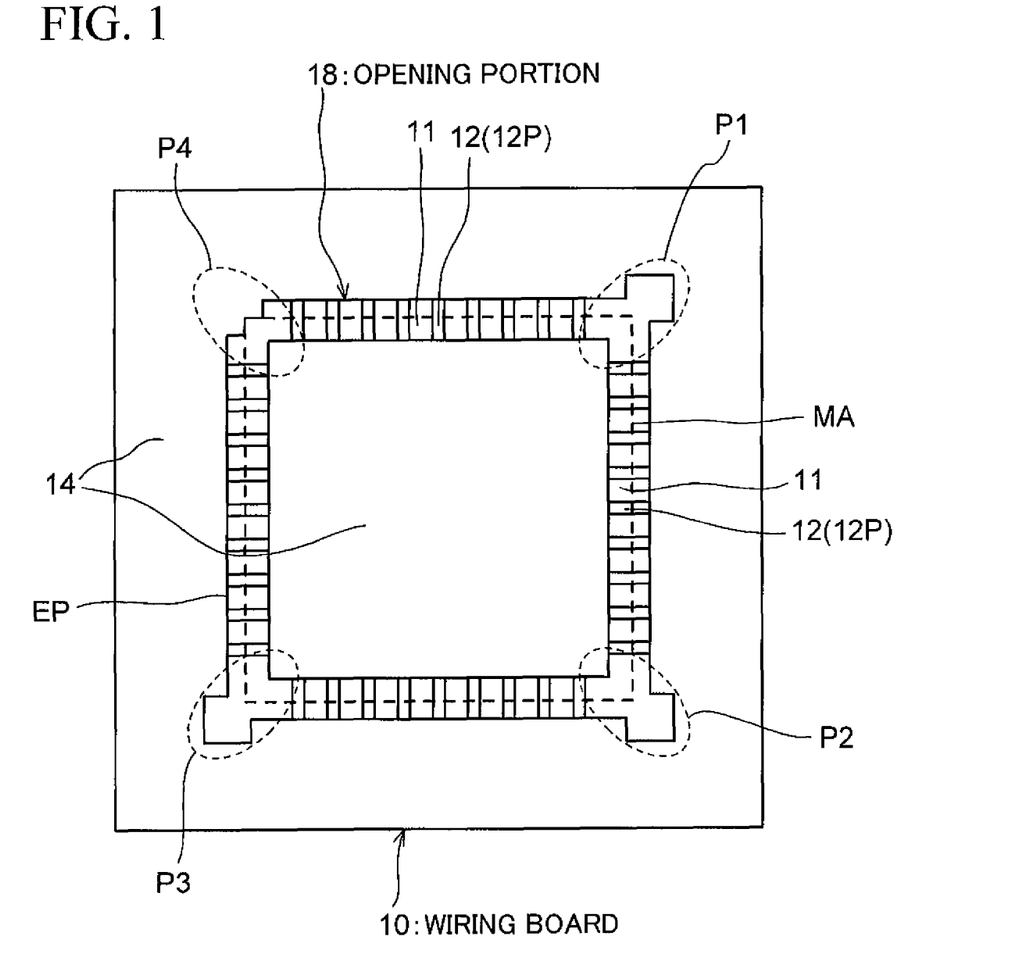
FIG. 1 is a plan view showing a configuration of a wiring board (package) for flip chip mounting according to one embodiment of the present invention.
Figure 2:
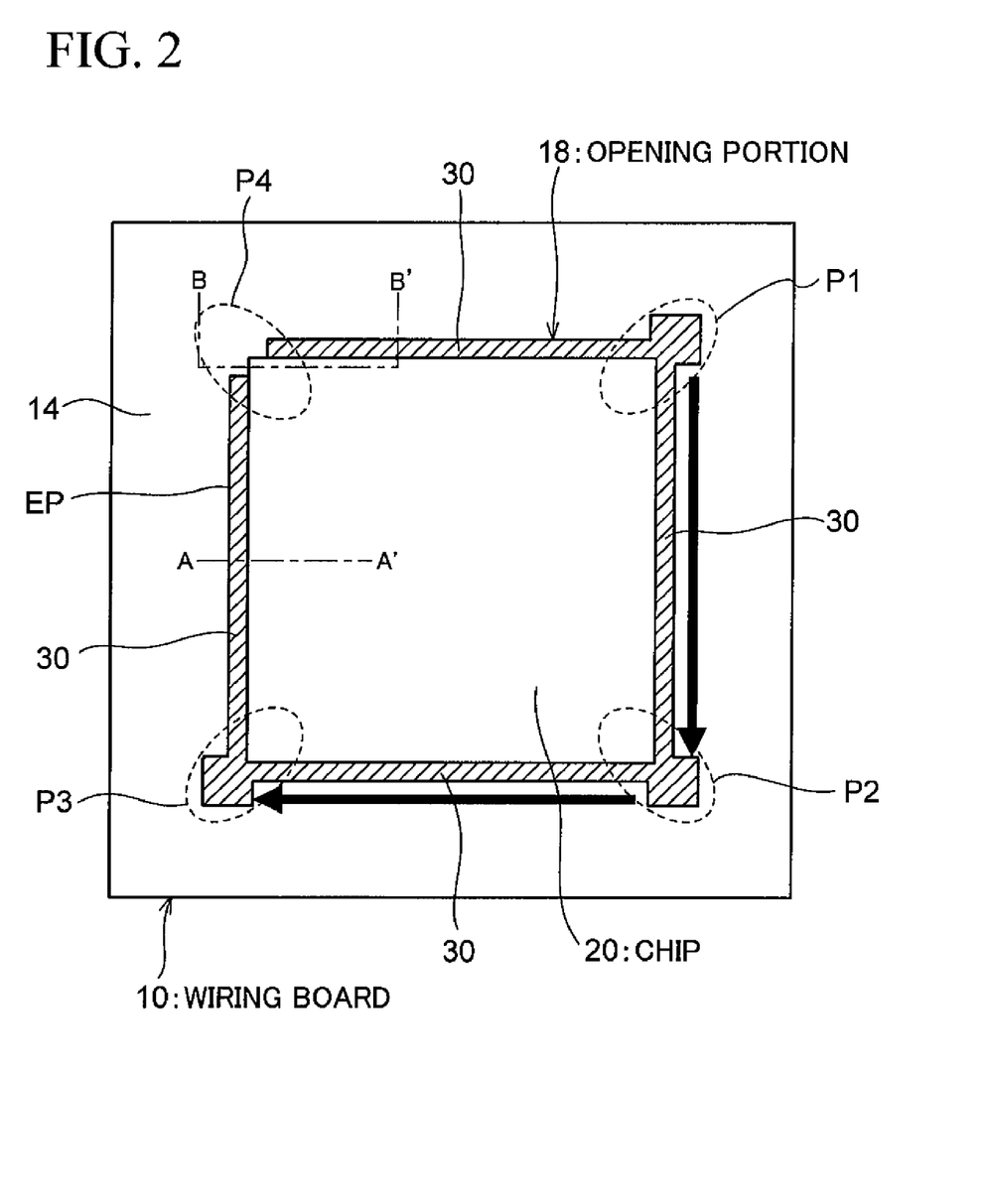
FIG. 2 is a plan view showing a state where a gap between a semiconductor chip and the wiring board of FIG. 1 is filled with resin when the semiconductor chip is mounted.
Figure 3A:
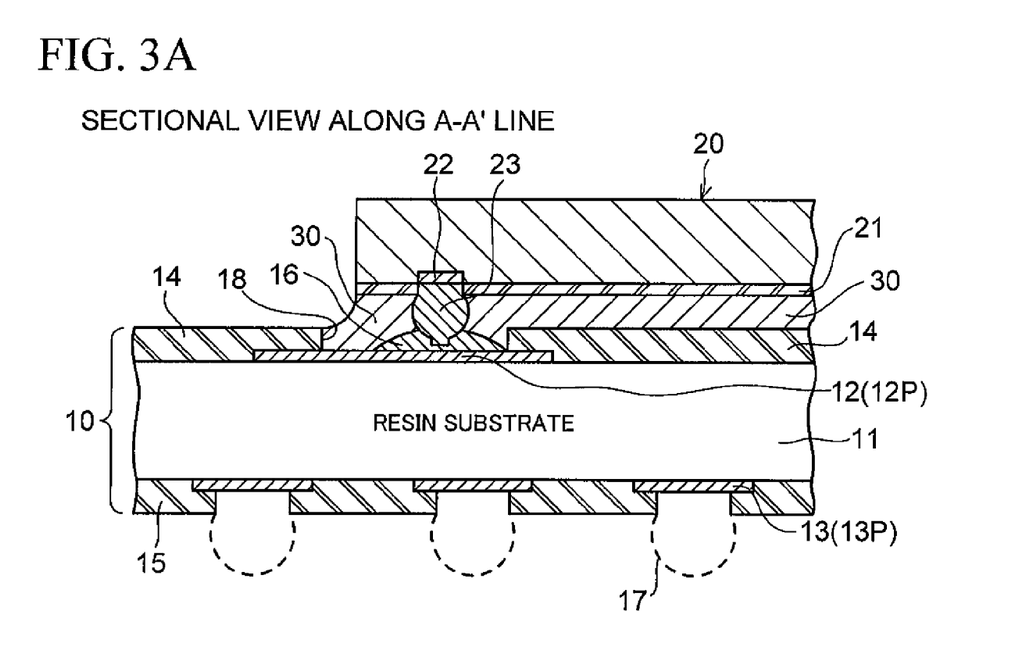
FIG. 3A is a view showing a cross-sectional structure when viewed along A-A' line of FIG. 2 (the vicinity of a portion along a side of the chip in the opening portion)
Figure 3B:
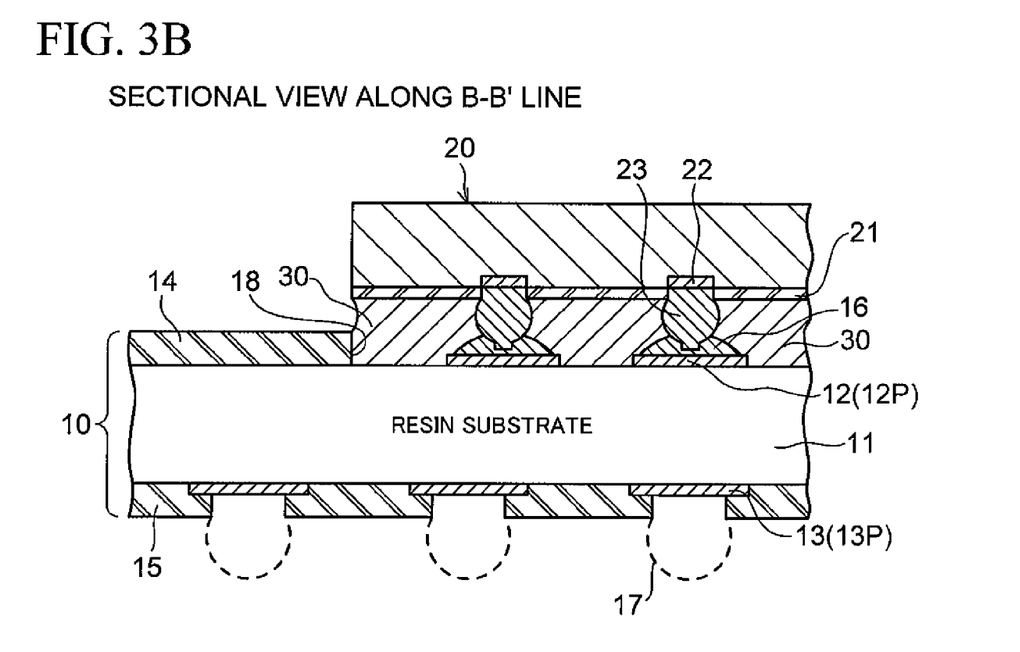
FIG. 3B is a view showing a cross-sectional structure when viewed along B-B' line of FIG. 2 (the vicinity of a corner portion in the opening portion)

FIG. 1 shows in a plan view, the configuration of a wiring board (package) for flip chip mounting according to one embodiment of the present invention. FIG. 2 shows in a plan view, a state where a gap between a semiconductor chip and the wiring board of FIG. 1 is filled with resin when the semiconductor chip is mounted. FIGS. 3A and 3B show a vertical cross-sectional structure of the vicinity of an opening portion of the solder resist layer in the configuration of FIG. 2. Specifically, FIG. 3A shows a cross-sectional structure when viewed along A-A' line of FIG. 2 (the vicinity of a portion along a side of the chip in the opening portion), and FIG. 3B shows a cross-sectional structure when viewed along B-B' line of FIG. 2 (the vicinity of a corner portion in the opening portion).

First, referring to FIGS. 3A and 3B, the wiring board (package) 10 according to this embodiment basically includes: a resin substrate 11 constituting a substrate body; wiring layers 12 and 13 each patterned in a predetermined shape and formed on both surfaces of the resin substrate 11; and insulating protection films 14 and 15 (solder resist layers) formed to coat both surfaces of the resin substrate 11 while exposing pad portions 12P and 13P defined at predetermined positions of the respective wiring layers 12 and 13. Copper (Cu) is typically used as a material for the wiring layers 12 and 13, and an epoxy insulating resin is used as a material for the solder resist layers 14 and 15.

An opening portion 18 required for exposing the pad portion 12P of the wiring layer 12 provided on the side of a surface on which a semiconductor chip 20 such as an IC or LSI is mounted (chip mounting surface) is formed in the solder resist layer 14 formed on the chip mounting surface side. Details of the opening portion 18 are described later.

A substrate having the configuration below is suitable for the resin substrate 11 constituting the substrate body of the package 10. Specifically, at least the wiring layers 12 and 13 are formed on the respective outermost surfaces of the substrate, and the wiring layers 12 and 13 are electrically connected through the inside of the substrate. A wiring layer may be formed inside the resin substrate 11. Where the configuration including a wiring layer formed inside the resin substrate 11 is employed, the wiring layers 12 and 13 on the respective outermost surfaces are electrically connected to each other via wiring layers formed inside the substrate with an insulating layer interposed therebetween and via holes (conductors filled into the via holes) for connecting the wiring layers. A detailed illustration of this case is omitted herein since this portion of the configuration is not a portion which characterizes the present invention. The substrate having this configuration is, for example, a multilayer wiring board obtained by build-up process. The multilayer wiring board is formed in the following manner. The formation of a conductive pattern (wiring layer), the formation of an insulating layer, and the formation of a via hole in the insulating layer are sequentially repeated on both surfaces of a core substrate, such as a glass-epoxy substrate, to thereby obtain a multilayer wiring structure. Finally, the respective outermost wiring layers are coated with protection films (solder resist layers), and portions (pad portions) of the conductive patterns are exposed by opening required portions. On the other hand, where a configuration not including wiring layers inside the resin substrate 11 is employed, the wiring layers 12 and 13 on the respective outermost surfaces are mutually electrically connected via a through hole (conductor filled in the through hole) formed in a required position of the resin substrate 11.

Moreover, a solder 16 is deposited on the pad portion (Cu) 12P by pre-soldering or the like in order to facilitate connection with an electrode terminal 23 when the chip 20 is mounted on the wiring board, the pad portion 12P being exposed from the solder resist layer 14 on the chip mounting surface side. For example, a eutectic solder or a lead free solder (Sn (tin)-Ag (silver), Sn—Cu (copper), Sn—Ag—Cu, or the like) is used for the solder 16. Note, the solder 16 for mounting a chip does not have to be necessarily provided, and the pad portion 12P may be kept exposed so that the electrode terminal of the chip can be connected thereto later when necessary (for example, at the shipping destination). In this case, the surface of the pad portion is preferably subjected to nickel (Ni) plating and gold (Au) plating in this order. This processing is to enhance contact properties when the electrode terminal is bonded to the pad portion, and to prevent Cu from diffusing into the Au layer while enhancing adhesiveness between the Au layer and the pad portion (Cu) 12P.

Likewise, the pad portions 13P are preferably subjected to the Ni/Au plating to achieve the same effects described above. This is because, as shown by broken lines in FIGS. 3A and 3B, external connection terminals 17 such as solder balls used when the wiring board 10 is mounted on a motherboard such as a printed wiring board are bonded to the pad portions 13P exposed from the solder resist layer 15 on the surface opposite to the chip mounting surface side. Such an external connection terminal may be provided before shipping the wiring board, or the pad portion 13P may be kept exposed to allow the external connection terminal to be bonded thereto later when necessary.

On the other hand, the chip 20 to be mounted on the wiring board (package) 10 includes a plurality of bump-shaped electrode terminals (bumps) 23 on the circuit formation surface (lower surface in the illustrated example). In this embodiment, the electrode terminals 23 of the chip 20 are arranged in a peripheral form (annular form along the circumference of the chip). For example, a gold (Au) bump, which can be formed using a wire bonding technique, is employed as the electrode terminal 23. Furthermore, reference numeral 21 denotes a protection film coated on the circuit formation surface, and reference numeral 22 denotes an electrode pad formed to be exposed from the protection film 21. In addition, the electrode terminal (Au bump) 23 is bonded to the electrode pad 22.

This chip 20 is bonded to the wiring board 10 by flip chip bonding. This flip chip bonding is performed by connecting the electrode terminals (Au bumps) 23 to the pad portions (Cu) 12P on the chip mounting surface side of the wiring board 10 via the solders 16 deposited on the pad portions (Cu) 12P.

An underfill resin 30 is filled into a gap between the chip 20 and the wiring board 10 which are thus bonded. As a material for the underfill resin 30, a thermosetting epoxy resin is typically used. Such a thermosetting epoxy resin has a low viscosity with flowability in a state before the resin is cured. The underfill resin 30 of this kind is made to flow into a gap between the chip 20 and the wiring board 10. Thereafter, the underfill resin 30 is fixed by curing through a heating process. As a result, stress generated due to a difference between coefficients of thermal expansion of the chip 20 and the wiring board 10 can be released. Furthermore, the bonded portion of the electrode terminal 23 and the wiring layer 12 (pad portion 12P) can be protected from the outside. Thus, reliability of the mounting of the chip can be enhanced.

Next, with reference to FIG. 1, description is given of the opening portion 18 formed in the solder resist layer 14. In FIG. 1, a square shaped area MA indicated by a broken line shows a region (mounting area) in which the semiconductor chip 20 is to be mounted. The shape of the mounting area corresponds to the outer shape of the chip 20.

In this embodiment, since the electrode terminals (bumps) 23 of the chip 20 are assumed to be arranged in a peripheral form as described above, the pad portions 12P for use in connecting the chip, which are to be formed on the wiring board 10, are also arranged in the annular form according to the peripheral form. For this reason, the opening portion 18 to be formed in the solder resist layer 14 for exposing the pad portions 12P is formed in a square annular form along the outer shape (mounting area MA) of the chip 20 to be mounted, as illustrated in FIG. 1.

Among four corners (corner portions P1 to P4) of the opening portion 18, the corner portions P1 to P3 are formed to be widely opened except one specific corner portion (the corner portion P4 in the illustrated example). In addition, the opening portion 18 is formed in such a manner that the outer edge EP thereof is positioned along and outside the mounting area MA (the outer shape of the chip 20) except the specific corner portion P4. Moreover, the opening portion 18 is formed in such a manner that the outer edge EP thereof is positioned on the sides of or inside the mounting area MA (the outer shape of the chip 20) at the specific corner portion P4. Although the specific corner portion P4 is positioned at the upper left side of the opening portion 18 in the illustrated example, the position of the specific corner portion is not limited to the illustrated position as a matter of course.

In essence, a corner portion linked to a side opposite to the injection side of the underfill resin 30 in the opening portion 18 needs to be selected as the "specific corner portion" when the underfill resin 30 is filled into a gap between the chip 20 and the wiring board 10 after the chip 20 is mounted. In this embodiment, as illustrated in FIG. 2, since the underfill resin 30 is injected from the two sides of the opening portion 18 (i.e., the side between the corner portions P1 and P2, and the side between the corner portions P2 and P3), the corner portion P4 positioned at the upper left side of the opening portion 18 is selected as the "specific corner portion" as illustrated.

The opening portion 18 is formed in the annular shape in this embodiment. Accordingly, the solder resist layer 14 is separated into two regions including a region outside the opening portion 18 (region formed outside the mounting area MA) and a region left inside the opening portion 18 in a land shape (region formed inside the mounting area MA).

As described above, according to the configuration of the wiring board 10 for flip chip mounting of this embodiment, the shape of the opening portion 18 to be formed in the solder resist layer 14 for exposing the pad portion 12P on the chip mounting surface side (see FIG. 1) is formed in the specific shape. Accordingly, when the underfill resin 30 is filled between the semiconductor chip 20 mounted on the wiring board 10 and the wiring board 10 (see FIG. 2), the resin 30 can be sufficiently filled in the sides opposite to the injection sides of the resin 30 (downstream side of the flow of the resin 30) and the opening portion of the specific corner portion P4 linked to the opposite sides without causing generation of void (air bubble) within the filled resin 30.

Specifically, when the filling (injection) of the underfill resin 30 is started from the corner portion P1 among three corner portions P1 to P3 which are widely opened in the opening portion 18, the underfill resin 30 is filled from the corner portion P1 into the inside of the opening portion 18 by capillary action, and air can be released from other corner portions P2 and P3. Thus, even if the underfill resin 30 is first spread over the solder resist layer 14 (the land shaped region left inside the opening portion 18), the resin 30 can be filled into the gap between the chip 20 and the wiring board 10 without causing generation of void within the filled resin 30.

In addition, the opening portion of the specific corner portion P4 is formed in such a manner that the outer edge EP of the opening portion 18 is positioned on the sides of or inside the outer shape of the chip 20. Accordingly, the "locally widely opened corner portion" such as the corner portion R4 in the prior art (see FIGS. 6A and 6B) does not exist in the corner portion P4. Specifically, the opening portion of the corner portion P4 positioned at the opposite sides of the injection sides of the resin 30 (downstream side of the flow of the resin 30) is formed relatively smaller, so that the resin 30 can be sufficiently filled into the opening portion of the corner portion P4. Thus, a disadvantage such as "insufficient flow of the underfill resin" such as encountered in the prior art can be removed. As a result, the flowability of the underfill resin 30 in the corner portion of the chip 20 (the position corresponding to the corner portion P4 in the opening portion 18) can be improved, and it is possible to contribute to a reliable formation of resin fillet at the corner portion (improvement in the outer appearance due to the insufficient amount of fillet).

Moreover, the opening portion 18 is formed in the annular shape in this embodiment, so that a portion of the region of the solder resist layer 14 is left in the land shape inside the opening portion 18. Thus, the wiring layer 12 can be formed at a lower portion of the land shaped solder resist layer 14. Suppose that a configuration in which the wiring layer 12 is formed without providing the solder resist layer in this region is employed, the circuit formation surface of the chip 20 directly faces the wiring layer 12 at the time of mounting the chip 20. Such a configuration is not preferable in terms of the protection and insulating properties of the chip 20. Contrary to this, where the land shaped solder resist layer 14 is formed as in the case of this embodiment, it is possible to maintain the protection and insulating properties of the chip 20 even when the wiring layer 12 is formed at a lower portion of the solder resist layer 14. In addition, the arrangement area of the wiring layer 12 can be made wider to thereby contribute to an increase in the degree of freedom in designing the arrangement pattern.

Figure 4:
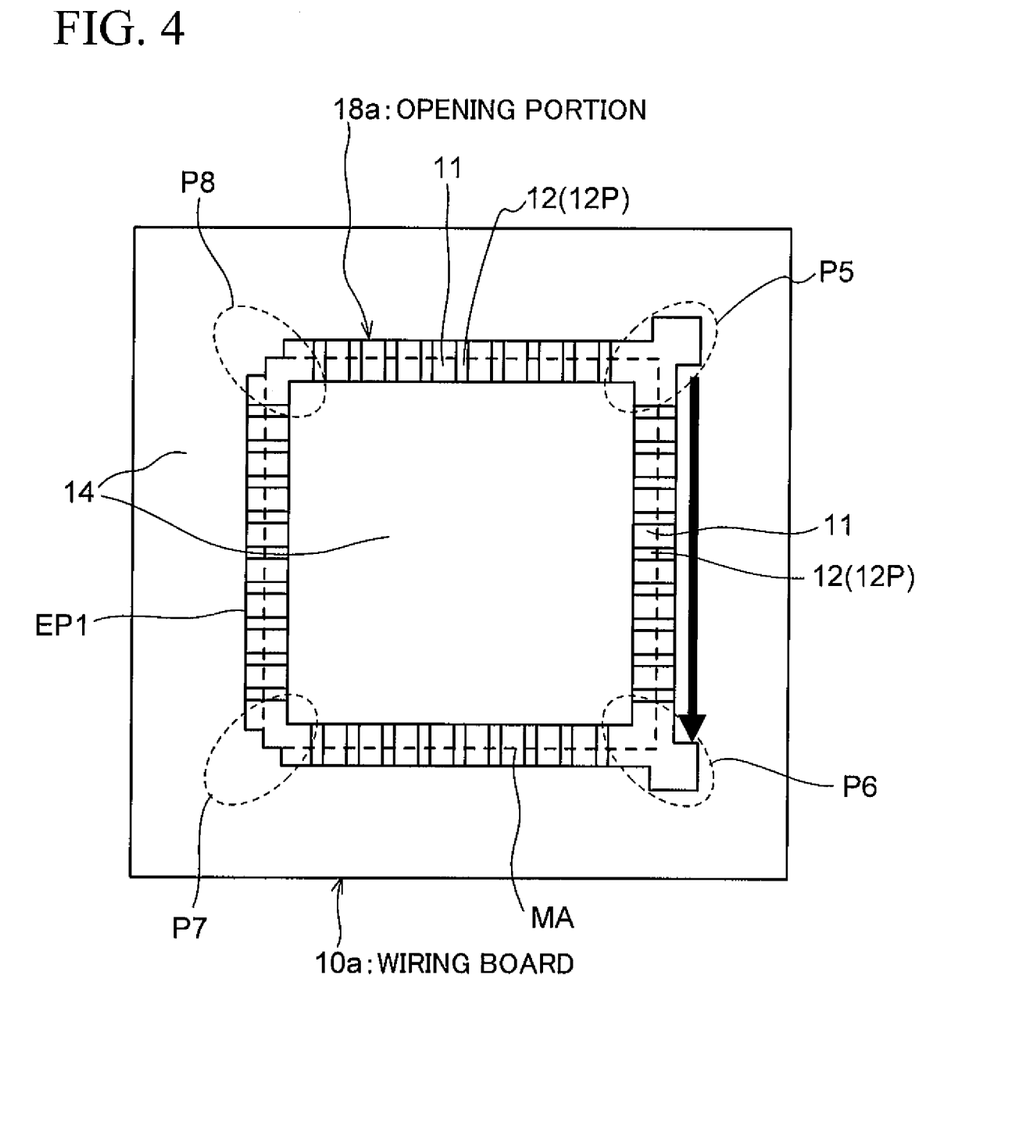
FIG. 4 is a plan view showing a configuration of a wiring board for flip chip mounting according to another embodiment of the present invention.

In the configuration of the wiring board 10 (FIG. 1) according to the above embodiment, assumption is made that the underfill resin 30 is injected from the two sides of the opening portion 18 (the sides corresponding to the portions shown by the arrows in FIG. 2). Accordingly, the description is given with an example of the case where the only one position of the opening portion 18, which is the corner portion P4, is selected as the "specific corner portion." However, the number of the specific corner portion is not limited to one as a matter of course. For example, where the underfill resin 30 is injected from one side of the opening portion is, two positions can be selected as the specific corner portions. FIG. 4 shows an example of the case.

In comparison with the wiring board 10 (FIG. 1) according to the above embodiment, a wiring board 10a for flip chip mounting according to an embodiment illustrated in FIG. 4 differs from the wiring board 10 in the following points. First, among four corner portions of an opening portion 18a (corner portions P5 to P8), the wiring board 10a includes, as the "specific corner portions," two corner portions P7 and P8 which are linked to a side opposite to the injection side of the underfill resin (portion shown by an arrow and positioned between the corner portions P5 and P6). Second, in the wiring board 10a, each of the opening portions of the two corner portions P7 and P8 is formed in such a manner that an outer edge EP1 of the opening portion 18a is positioned on the sides of or inside the mounting area MA. The other portions of the configuration are basically the same as those of the wiring board 10 according to the above embodiment, and thus the description thereof is omitted herein.

In the configuration of the wiring board 10a according to this embodiment (FIG. 4), the shape of the opening portion 18a to be formed in the solder resist layer 14 for exposing the pad portion 12P on the chip mounting side is formed in the specific shape, as in the case of the wiring board 10 (FIG. 1) according to the above embodiment. Thus the like advantageous effects can be brought about as in the case of the wiring board 10 according to the above embodiment.

Figure 5A:
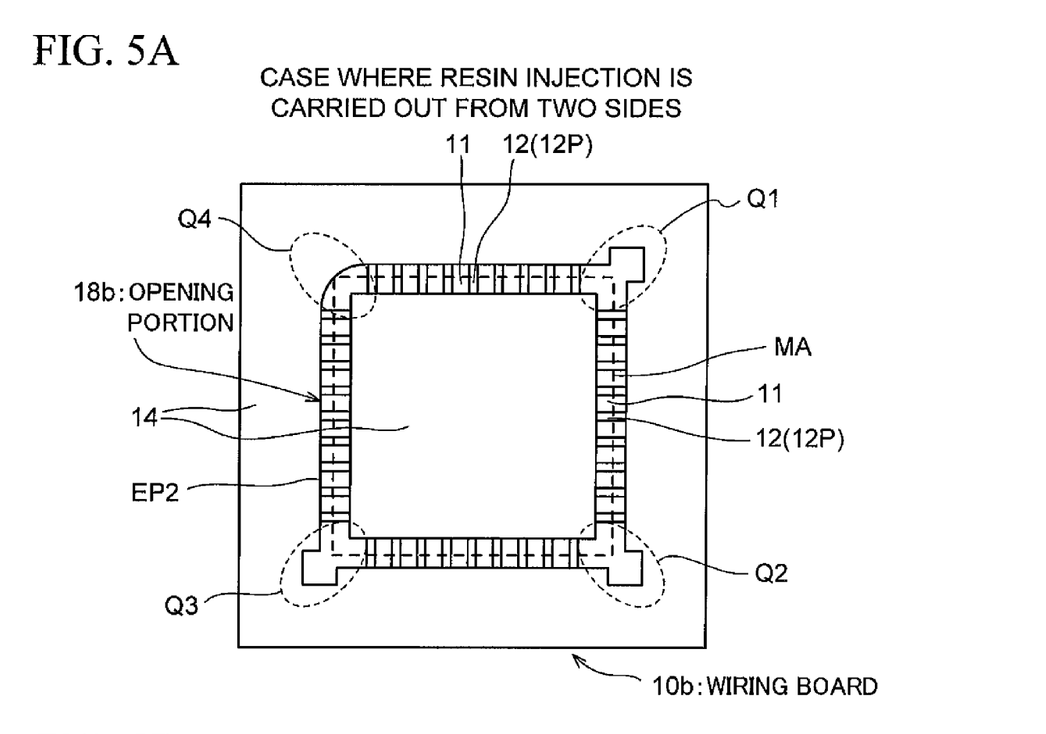
FIG. 5A is a plan view of the case where an opening portion is formed in a layout corresponding to the wiring board of FIG. 1.
Figure 5B:
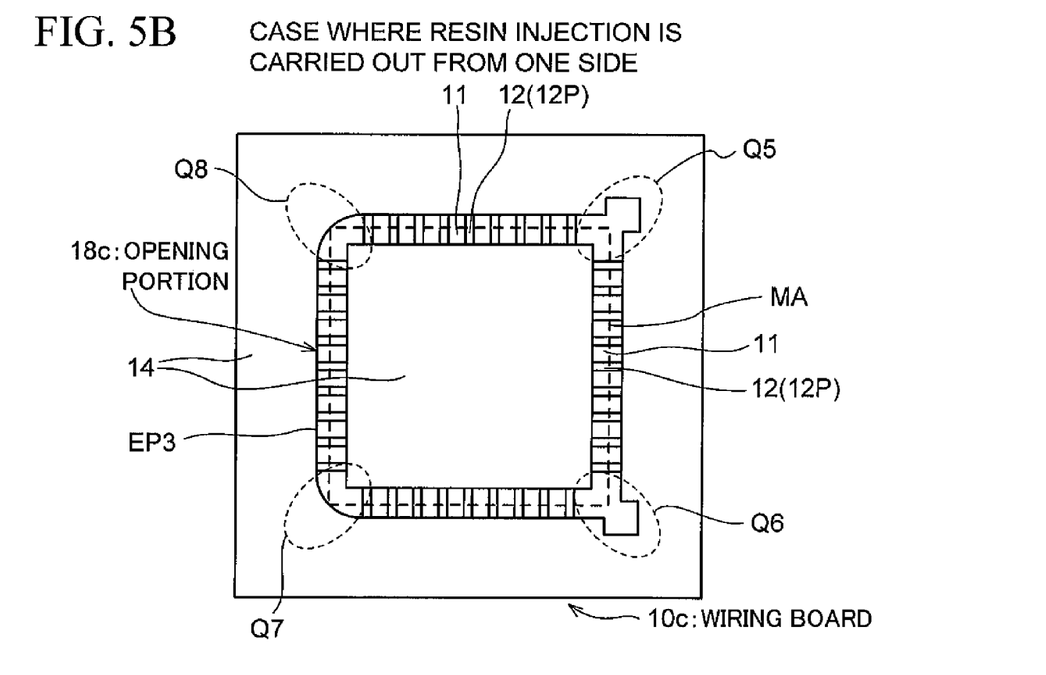
FIG. 5B is a plan view of the case where an opening portion is formed in a layout corresponding to the wiring board of FIG. 4.

With respect to each of the above embodiments (FIGS. 1 and 4), the description is given of the case where each of the opening portions of the specific corner portions P4, P7 and P8 is formed in such a manner that the outer edge of the opening portion is positioned on the sides of or inside the mounting area MA. However, as apparent from the gist of the present invention, the shape of the opening portion is not limited to this, and can be formed in a different shape. FIGS. 5A and 5B illustrate an embodiment of the case.

FIG. 5A shows in plan view, the configuration of a wiring board 10b in the case where an opening portion 18b is formed in a layout corresponding to the wiring board 10 of FIG. 1. FIG. 5B shows in plan view, the configuration of a wiring board 10c in the case where an opening portion 18c is formed in a layout corresponding to the wiring board 10a of FIG. 4.

In comparison with the wiring board 10 of FIG. 1, the wiring board 10b for flip chip mounting according to the embodiment shown in FIG. 5A is different in that one corner portion Q4 in the opening portion 18b, which is selected as the "specific corner portion" from among corner portions Q1 to Q4 in the opening portion 18b, is formed in a curved manner so that an outer edge EP2 of the opening portion 18b passes through the tip of the corner of the mounting area MA. The other portions of the configuration are basically the same as those of the wiring board 10 according to the above embodiment, and thus the description thereof is omitted herein.

On the other hand, in comparison with the wiring board 10a of FIG. 4, the wiring board 10c for flip chip mounting according to the embodiment shown in FIG. 5B is different in that each of two corner portions Q7 and Q8 in the opening portion 18c, which are selected as the "specific corner portions" from among corner portions Q5 to Q8 in the opening portion 18c, is formed in a curved manner so that an outer edge EP3 of the opening portion 18c passes through the tip of the corresponding corner of the mounting area MA. The other portions of the configuration are basically the same as those of the wiring board 10a according to the above embodiment, and thus the description thereof is omitted herein.

In the configuration of each of the wiring boards 10b and 10c according to the respective embodiments shown in FIGS. 5A and 5B, the shape of each of the opening portions 18b and 18c to be formed in the solder resist layer 14 is formed in the specific shape, as in the cases of the wiring boards 10 (FIG. 1) and 10a (FIG. 4) according to the above embodiments. Thus the like advantageous effects can be brought about as in the cases of the wiring boards 10 and 10a according to the above embodiments.

Note that, the injection of resin does not have to be necessarily started from a corner portion as a matter of course, although the above description is given with the example of the case where the resin is injected from any of the corner portions (e.g., P1 and P2 in FIG. 2) in the opening portion (the opening portion 18 in FIG. 2), and the filling of resin into the opening portion 18 is carried out by moving the nozzle to the adjacent corner portions (P2 and P3 in FIG. 2) along the sides of the opening portion. For example, the injection of resin may be started from a middle portion of any of sides of an opening portion (resin injection side), and the filling of resin may be carried out by moving the nozzle along the side as in the above case. In this case, all of the four corners of the opening portion can be selected as the above specific corner portions (P4, P7, P8, Q4, Q7 and Q8). Alternatively, only two corner portions spaced from each other in a diagonal direction may be selected as the "specific corner portions."

In addition, the above description is given with the example of the case where the shape of the opening portion 18 (18a, 18b, 18c) to be formed in the solder resist layer 14 for exposing the pad portion 12P on the chip mounting surface side of the package is formed in a square annular shape along the outer shape of the chip 20 to be mounted (mounting area MA). However, as apparent from the gist of the present invention, the shape of the entire opening portion is not limited to this shape. For example, the opening portion may be formed to be opened over the entire region of the mounting area MA of the chip 20. In this case, the above land shaped portion of the solder resist layer 14 (the region formed inside the mounting area MA) is not formed.

Moreover, the above description is given with the example of the case where the semiconductor chip 20 as the object to be mounted is mounted on the wiring board 10 (10a, 10b, 10c) as the package. However, the object to be mounted on the package (wiring board) is not limited to the chip as a matter of course. For example, the present invention can be applied to a flip chip mounting type package having a structure in which another package (wiring board) or a semiconductor device is stacked on the package (wiring board) (package-on-package).

Moreover, the above description is given with the example of the case where the resin substrate 11 (in which the wiring layers 12 and 13 are formed on the respective outermost layers; the pad portions 12P and 13P defined in the respective wiring layers are exposed; and the wiring layers are coated with the respective solder resist layers 14 and 15) is used as the substrate body of the package. However, the substrate body to be used is not limited to a resin substrate as a matter of course. Basically, any package substrate having a flip chip mounting type structure can be used. For example, a silicon substrate used in a chip size package (CSP) may be used. In this configuration, instead of the above wiring layers 12 and 13 (pad portions 12P and 13P), aluminum (Al) electrode pads are provided on the silicon (Si) substrate, and instead of the solder resist layers 14 and 15, passivation films made of $SiO_2$, SiN, polyimide resin or the like may be provided. Additionally, as another configuration, a ceramic type substrate or the like may be used.

What is claimed is:

1. A wiring board comprising:
    a wiring board and an object arranged to be mounted thereon, such that a resin is filled therebetween when the object is mounted, the object having a polygonal shape in a plan view and having a bump-shaped electrode terminal on a mounting surface side thereof, the wiring board including:
    a substrate body including a conductor portion formed thereon, the conductor portion being to be connected to the electrode terminal of the object; and
    an insulating protection film formed on the entire surface of the substrate body other than an opening portion and extending from a center portion of the substrate body to the edges thereof, the opening portion being formed to expose at least the conductor portion in a mounting area corresponding to an outer shape of the object,
    wherein the opening portion in said insulating protection film is formed in such a manner that an outer edge thereof is positioned along and outside the mounting area of the object except for at least one corner portion of the opening portion, and said opening portion in said insulating, protection film is formed to be widely opened at other corner portions except for the at least one corner portion, and,
    wherein the opening portion in said insulating protection film is formed in such a manner that the outer edge thereof in the at least one corner portion is positioned to coincide with the periphery of the mounting area of the object, or to be inside the mounting area of the object, and wherein a side surface of the insulating protection film which defines the outer edge of the opening portion in said insulating protection film, and a side surface of the object, are spaced from each other in the height direction.

2. The wiring board according to claim 1, wherein the opening portion in said insulating protection film is formed in such a minter that the outer edge thereof in the at least one corner portion is formed in a curved manner to pass through the tip of a corner of the mounting area of the object.

3. The wiring board according to claim 1, wherein the opening portion in said insulating protection film is formed in such a manner that the outer edge thereof in a maximum of two corner portions is positioned to coincide with the periphery of the mounting area of the object, or is positioned to be inside the mounting area of the object when an object having a rectangular shape in a plan view is mounted as the object to be mounted.

4. The wiring board according to claim 2, wherein the opening portion in said insulating protection film is formed in such a manner that the outer edge thereof in a maximum of two corner portions is formed in a curved manner to pass through the tip of the corner of the mounting area of the object when an object having a rectangular shape in a plan view is mounted as the object to be mounted.

5. The wiring board according to claim 1, wherein the opening portion in said insulating protection film is formed in an annular shape along the mounting area of the object.

6. The wiring board according to claim 1, wherein the opening portion in said insulating protection film is formed to be opened all over the mounting area of the object.

7. The wiring board according to claim 1, wherein the wiring board is adapted to mount thereon any one of a semiconductor chip, another wiring board and a semiconductor device as the object to be mounted.

* * * * *